(12) United States Patent
Siang et al.

(10) Patent No.: US 9,184,151 B2
(45) Date of Patent: Nov. 10, 2015

(54) MIXED WIRE BONDING PROFILE AND PAD-LAYOUT CONFIGURATIONS IN IC PACKAGING PROCESSES FOR HIGH-SPEED ELECTRONIC DEVICES

(75) Inventors: Ng Kok Siang, Penang (MY); Wong Wai Loon, Perak (MY)

(73) Assignee: Cypress Semiconductor Corporation, San Jose, CA (US)

( * ) Notice: Subject to any disclaimer, the term of this patent is extended or adjusted under 35 U.S.C. 154(b) by 739 days.

(21) Appl. No.: 13/046,433

(22) Filed: Mar. 11, 2011

(65) Prior Publication Data

US 2012/0228783 A1     Sep. 13, 2012

(51) Int. Cl.
*H01L 21/44* (2006.01)
*H01L 23/488* (2006.01)
*H01L 23/00* (2006.01)

(52) U.S. Cl.
CPC ............. *H01L 24/85* (2013.01); *H01L 24/06* (2013.01); *H01L 24/48* (2013.01); *H01L 24/49* (2013.01); *H01L 2223/6611* (2013.01); *H01L 2223/6638* (2013.01); *H01L 2224/04042* (2013.01); *H01L 2224/05553* (2013.01); *H01L 2224/05554* (2013.01); *H01L 2224/06153* (2013.01); *H01L 2224/06155* (2013.01); *H01L 2224/48463* (2013.01); *H01L 2224/4903* (2013.01); *H01L 2224/49171* (2013.01); *H01L 2224/49433* (2013.01); *H01L 2224/85* (2013.01); *H01L 2924/10253* (2013.01); *H01L 2924/14* (2013.01); *H01L 2924/3011* (2013.01); *H01L 2924/30107* (2013.01)

(58) Field of Classification Search
CPC ............................ H01L 23/488; H01L 21/44
USPC ............. 257/782, E23.023, E21.476; 438/612
See application file for complete search history.

(56) References Cited

U.S. PATENT DOCUMENTS

| | | | |
|---|---|---|---|
| 5,468,999 A * | 11/1995 | Lin et al. .................. | 257/784 |
| 6,812,580 B1 * | 11/2004 | Wenzel et al. ............ | 257/784 |
| 2005/0280915 A1 * | 12/2005 | Engelmeyer et al. ..... | 360/55 |
| 2006/0000876 A1 * | 1/2006 | Nickerson et al. ........ | 228/180.5 |
| 2006/0192300 A1 * | 8/2006 | Appel et al. .............. | 257/784 |
| 2008/0122115 A1 * | 5/2008 | Popa et al. ................ | 257/777 |
| 2010/0032818 A1 * | 2/2010 | Pilling et al. ............. | 257/676 |
| 2010/0320623 A1 * | 12/2010 | Kuroda et al. ............ | 257/784 |

* cited by examiner

*Primary Examiner* — Marc Armand

(57) ABSTRACT

A method and apparatus for mixed wire bonding and staggered bonding pad placement. A first plurality of bonding pads is arranged on a semiconductor device. A second plurality of bonding pads is also arranged on the semiconductor device. The bonding pads of the second plurality of bonding pads are arranged in a staggered pattern, such that the first and second pluralities of bonding pads form one of a plurality of double rows of bonding pads on the semiconductor device.

27 Claims, 4 Drawing Sheets

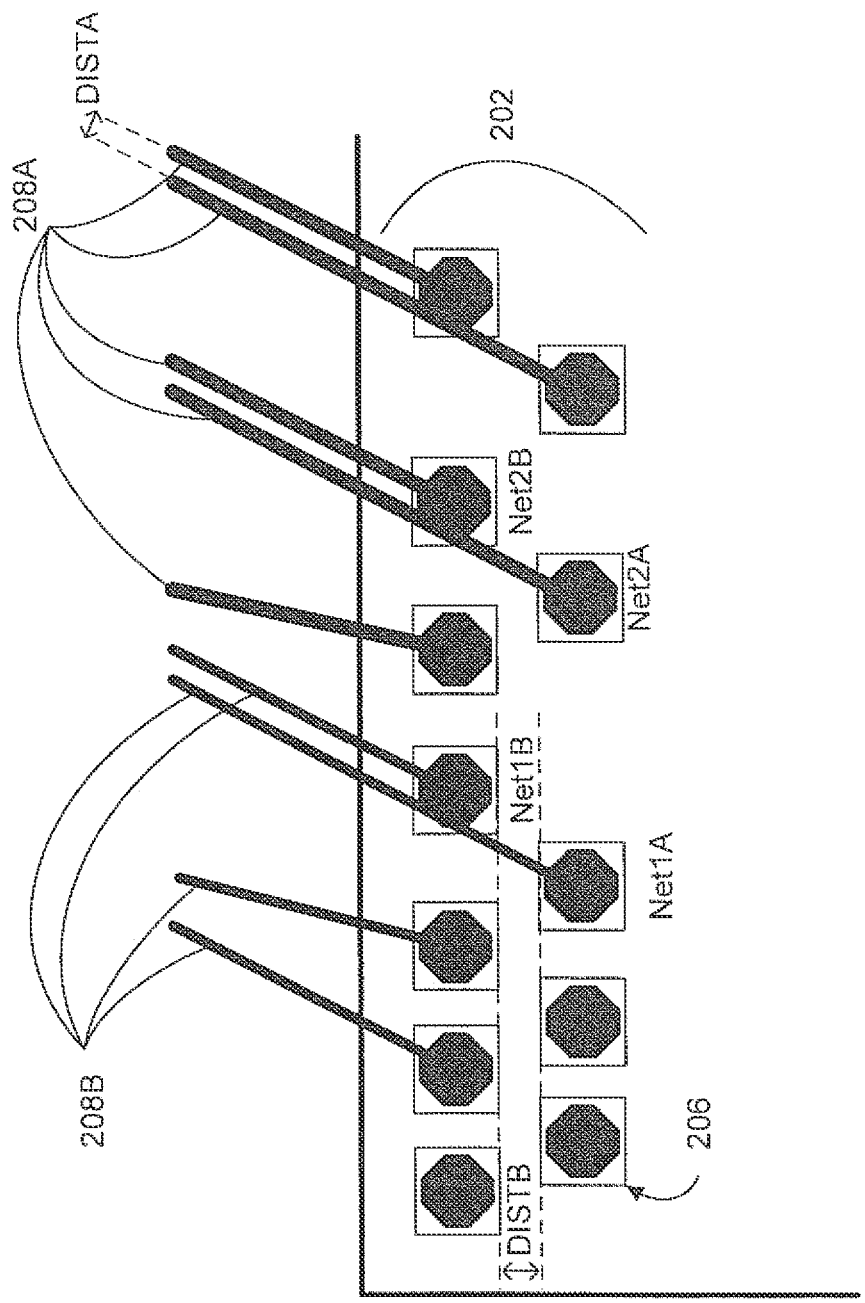

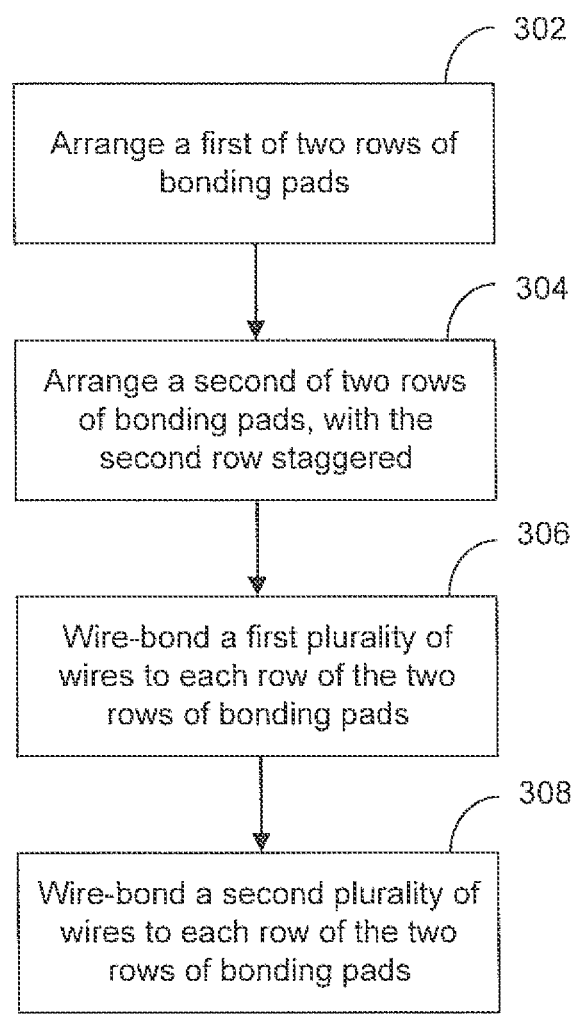

MIXED WIRE BONDING PROFILE AND PAD-LAYOUT CONFIGURATIONS IN IC PACKAGING PROCESSES FOR HIGH-SPEED ELECTRONIC DEVICES

TECHNICAL FIELD

The present disclosure relates generally to the field of semiconductor devices and more specifically to the field of wire-bonding and pad-layout configurations for electronic devices with input/output signal interfaces handling all types of high-speed signals including differential pairs.

BACKGROUND

The trend in the semiconductor industry today is the production of ever increasingly more capable semiconductor components, while decreasing component size and increasing total semiconductor package density. With the need to achieve ever smaller package sizes and handle additional high-speed input/output signals, new wire-bonding and pad-layout configurations are sought.

Conventional wire-bonding methods, as illustrated in FIG. 1, are unable to fully accommodate high-speed differential pairs of signals which optimally require two wire bonds (e.g., a pair of copper or gold interconnectors) to be physically bonded as close to each other as possible in order to achieve maximum coupling effects and as high a common-mode rejection ratio (CMRR) as possible within the electronics device. FIG. 1 illustrates a conventional single row of wire-bond pad arrays 102, most often seen in typical integrated circuit (IC) package manufacturing processes. Note that as illustrated in FIG. 1, there are only two rows of in-line conventional bonding pads 102, one on each side of the silicon die 104 (e.g., semiconductor chip).

In order to meet the signal transmission requirements of high speed signals (e.g., high-speed differential pairs) received by input-output (I/O) interfaces seen in, for example, DDR-III memory modules and PCI-E electrical interfaces, as well as an increased quantity of input/output signals, conventional bonding methods would require longer rows of bond pads and hence a larger die size to accommodate the growing numbers of bonding pads (to accommodate the increased quantity of I/O signals). In other words, there is fixed quantity of wires that can be bonded to a silicon die of a given size without enlarging the silicon die size. Furthermore, the close coupling between adjacent wire bonds is not adequate to meet the tightening production parameters using current methods of wire-bonding, as illustrated in FIG. 1.

SUMMARY OF THE INVENTION

This present invention provides a solution to the challenges inherent in meeting the tighter parameters required for input/output interfaces handling high-speed differential pairs while maintaining a same or smaller die size. In a method according to one embodiment of the present invention, a process for mixed wire bonding and staggered bonding pad placement is disclosed. A first plurality of bonding pads is arranged on a semiconductor device. A second plurality of bonding pads is also arranged on the semiconductor device. The bonding pads of the second plurality of bonding pads are arranged in a staggered pattern, such that the first and second pluralities of bonding pads form one of a plurality of double rows of bonding pads on the semiconductor device.

In the process for manufacturing the semiconductor device, a first wire bonded to a first bonding pad of the first plurality of bonding pads is of a different diameter than a second wire bonded to a second bonding pad of the first plurality of bonding pads. A third wire bonded to a third bonding pad of the second plurality of bonding pads is of a different diameter than a fourth wire bonded to a fourth bonding pad of the second plurality of bonding pads. Further, the third bonding pad of the second plurality of bonding pads is positioned such that the third wire bonded to the third bonding pad is a substantially uniform distance from the first wire bonded to the first bonding pad of the first plurality of bonding pads.

BRIEF DESCRIPTION OF THE DRAWINGS

The present invention will be better understood from a reading of the following detailed description, taken in conjunction with the accompanying drawing figures in which like reference characters designate like elements and in which:

FIG. 2B illustrates a top-down view of a portion of FIG. 2A illustrating double rows of bonding pads and wires in accordance with an embodiment of the present disclosure; and FIG. 3 illustrates a flow diagram, illustrating the steps to a method in accordance with an embodiment of the present invention.

DETAILED DESCRIPTION

Figure 1:
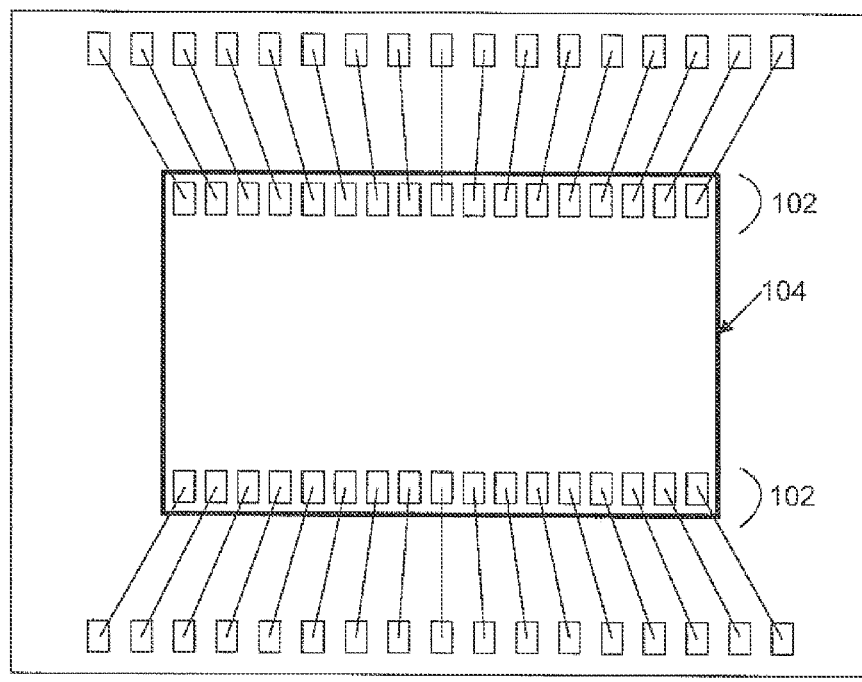
FIG. 1 illustrates a top-down schematic view of a semiconductor device according to the prior art exhibiting single rows of bonding pads and wires.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation and accommodate multiple pluralities of bonding pads.

Notation and Nomenclature:

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

This present invention provides a solution to the increasing challenges inherent in meeting the tighter parameters required for additional input/output interfaces handling high-speed differential pairs while maintaining a same or smaller package size. Various embodiments of the present disclosure provide wire-bonds with improved mutual and loop inductance to meet high-speed signaling requirements. Such embodiments will also have better control over wire-bond diameters, loop heights and bonding angles. Finally, these embodiments will also have improved flexibility to better determine wire-bond impedance in order to match the parameters of input/output interfaces handing high-speed differential pairs. As discussed in detail below, such improved signal wiring is accomplished through a novel wire-bond pay layout configuration using pairs of bonding pad rows and staggered bonding pads in one of the rows of each pair.

Figure 2A:
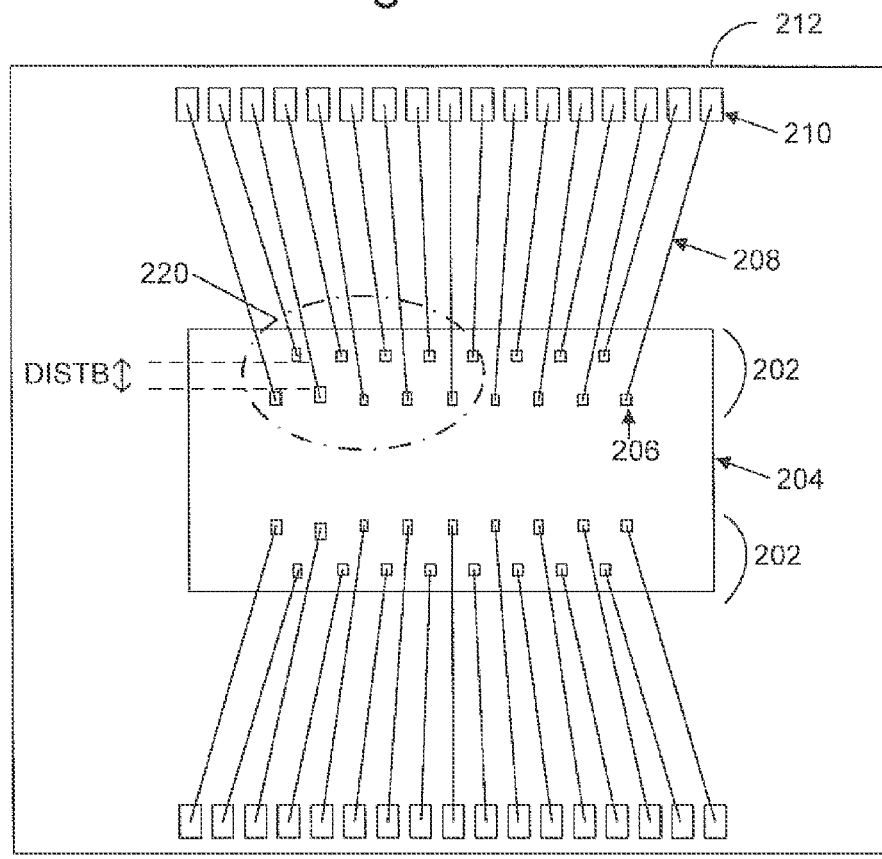
FIG. 2A illustrates a top-down schematic view of a semiconductor device in accordance with an embodiment of the present disclosure.

As illustrated in FIGS. 2A and 2B, and discussed in detail below, exemplary embodiments comprise a combination of double-row staggered wire-bonds which can be formed from pairs of single-line, conventional pad-layout rows and mixed wire-bond diameters in one device, assembled in a single integrated circuit (IC) package. FIGS. 2A and 2B are not drawn to scale and certain elements are exaggerated for the sake of clarity. A unique feature of placing bonding pads in pairs of rows on a silicon die, according to this disclosure, can help accommodate an increased number of input/output (I/O) peripherals on a single device. As discussed below, and illustrated in FIG. 2B, the staggered bonding pads also allow for a selected optimal distance DISTA between wires of differential pairs.

FIG. 2A illustrates pairs of bonding pad rows 202 arranged on each side of a silicon substrate or die-pad 204. An exemplary embodiment utilizes a standard sized bonding pad 206, with a distance DISTB between the rows of the pairs of bonding pad rows 202 of approximately 100-150 microns. Additional embodiments can also have nominal pad-sizes of 60×60 to 80×80 microns (width*height). Each individual bonding pad 206 can have a wire 208 bonded to it that leads to an associated external bond finger 210 of an external interface 212. As discussed in detail below, embodiments of the present disclosure can be further enhanced by utilizing a combination of different wire-bond diameter sizes on a same semiconductor chip or device to further improve mutual-loop inductance noise susceptibility.

FIG. 2B illustrates a portion 220 of a pair of bonding pad rows 202 of FIG. 2A. As illustrated in FIG. 2B, a plurality of bonding pads 206 are arranged in a pair of rows 202. FIG. 2B further illustrates the "staggering" of bonding pads 206 in one of the rows of bonding pads. Such staggering allows for high-speed differential pairs (Net1A and Net1B; and Net2A and Net2B) to be wire bonded to bonding pads with close proximity for mutual-coupling among the pairs of wires, in order to improve the differential impedance requirement. As illustrated in FIGS. 2A and 2B, the paired wires (Net1A, Net1B; and Net2A, Net2B) are paired for a similar wire thickness, a uniform distance apart, and uniform wire length. Such paired wires (Net1A, Net1B; and Net2A, Net2B) can therefore be optimized for very low inductance and low resistance.

The staggered configuration of bonding pads 206 allows the distance between pairs of wires (Net1A, Net1B; and Net2A, Net2B) to be optimized for maximum mutual inductance effect. In an exemplary embodiment, the pairs of wires (Net1A, Net1B; and Net2A, Net2B) are coupled to different types of input/output interfaces with different specification requirements that have to be individually met. In other words, the distance between paired wires for each pair of wires (Net1A, Net1B; and Net2A, Net2B) can be different and determined by specification requirements to meet desired inductance and resistance parameter requirements.

As further illustrated in FIG. 2B, in an exemplary embodiment, the paired wire bonds Net1A and Net1B have smaller wire-diameters than the other pair of wire bonds Net2A and Net2B. Such differences in wire diameters are due to electrical requirements for differential input/output signals operating at similar frequency ranges but with different impedance characteristics (Zo) and impedance differentials (Z0diff) as required by production specifications. In one embodiment, the wire diameters for wire pair Net2A, Net2B are between 1.0 and 1.1 mil in diameter, while the wire diameters for wire pair Net1A, Net1B are between 0.8 and 0.9 mil in diameter. Other wire diameters are also possible and included within the scope of this disclosure. As discussed below, when incorporating more than one wire diameter, the processes for wire bonding can require more than one wire bonding pass, with separate wire bonding passes required for each wire diameter. Such a variety of wire diameters is an improvement over the conventional techniques that utilize only a single, uniform diameter.

While various embodiments can incorporate staggered bonding pads to determine the distance between pairs of wires, but with a single, uniform diameter, embodiments, as illustrated in FIGS. 2A and 2B, can incorporate methods to perform wire-bonding processes resulting in staggered bond-pads to the IC package's bond fingers, with plurality of wire-bonding physical dimensions (e.g., wire diameters, loop heights, and lengths) combined with various pad-layout configurations on a single silicon die. Such embodiments provide a novel wire-bonding process and layout methodology which allows the effective differential impedance of high-speed input/output wire pairs to meet the specific differential impedance value requirements as determined by production specifications.

This novel way of arranging the wire-bond layouts in various physical entities (with different wire diameters, paired wire distances, and wire-bonding loop heights) can entail the use of a plurality of pairs of rows of bonding pads on the chip periphery utilizing a conventional, single row, in-line arrangement for each row on a single die. In other words, each row of each pair of rows can be formed as a conventional, single row, in-line arrangement paired with another row. As illustrated in FIGS. 2A and 2B, the second row of each pair of rows can be formed of staggered bonding pads. As illustrated and discussed above, the staggered bonding pad arrangements will allow for I/O peripheral areas which consist of high-speed differential pairs to be bonded with close proximity for mutual-coupling among a pair of wires, in order to improve the differential impedance requirement. The efficiency of power delivery circuits to supply clean-voltages from the lead-frames or IC package bond fingers on the silicon die will not be affected by implementing embodiments utilizing mixed-configuration bonding pads (e.g., pairs of rows of bonding pads with staggered bonding pads).

FIG. 3 illustrates the steps to a process for providing wire-bonds with improved mutual and loop inductance to meet high-speed signaling requirements. The steps of the process illustrated in FIG. 3 provide a wire-bond pad layout configuration using pairs of bonding pad rows and staggered bonding pads in one of the rows of each pair, with staggered bonding pads placed to ensure the desired distance between wires of a pair of wires. Steps of the process in FIG. 3 also provide wire diameters selected to meet desired inductance and resistance parameters.

In step 302 of FIG. 3, the first of a pair of rows of bonding pads are placed on a semiconductor device. As mentioned above, the bonding pads in one embodiment are of a standard size. In one embodiment, the bonding pads in the first row can be arranged as a convention row of bonding pads.

In step 304 of FIG. 3, the second row of bonding pads are placed on the semiconductor device to form a pair of bonding pad rows. As illustrated in FIGS. 2A and 2B, the bonding pads of the second row of the pair of rows are placed in a staggered, in-line configuration, such that differential pairs can be wire-bonded a predetermined distance DISTA apart. In one embodiment, each differential pair can have a different distance DISTA when compared to another differential pair.

In step 306 of FIG. 3, a first plurality of wires is wire bonded to the rows of bonding pads, wherein the first plurality of wires are of a same wire diameter. In step 308 of FIG. 3, a second plurality of wires are wire bonded to the rows of bonding pads, wherein the second plurality of wires are of a same wire diameter and of a different diameter than the first plurality of wires. In one embodiment, each differential pair of wires of a plurality of differential pairs has a different wire diameter as well as a different distance between wires, as compared to the other differential pairs of the plurality of differential pairs.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A semiconductor device comprising:
   a first plurality of bonding pads arranged on a semiconductor device; and
   a second plurality of bonding pads arranged on the semiconductor device, wherein the first plurality of bonding pads forms a first row in a first plane parallel to a first edge of the semiconductor device, and the second plurality of bonding pads forms a second row in a second plane parallel to the first edge, the first plane proximal to the first edge, wherein one of the first plurality of bonding pads and one of the second plurality of bonding pads forms a differential pair, and wherein wires bonded to the first and second pluralities of bonding pads each extend to associated external bond fingers arranged in a single row parallel to the first edge of the semiconductor device, wherein a spacing between the wires bonded to the one of the first plurality of bonding pads and the one of the second plurality of bonding pads of the differential pair remains substantially uniform, wherein spacing between second bonding pads of the second plurality of bonding pads is variable.

2. The semiconductor device of claim 1, wherein a first wire bonded to a first bonding pad of the first plurality of bonding pads is of a different diameter than a second wire bonded to a second bonding pad of the first plurality of bonding pads, and wherein a third wire bonded to a third bonding pad of the second plurality of bonding pads is of a different diameter than a fourth wire bonded to a fourth bonding pad of the second plurality of bonding pads.

3. The semiconductor device of claim 2, wherein the third bonding pad of the second plurality of bonding pads is positioned such that the third wire bonded to the third bonding pad is a substantially uniform distance from the first wire bonded to the first bonding pad of the first plurality of bonding pads.

4. The semiconductor device of claim 2, wherein the first wire and the third wire have the same diameter.

5. The semiconductor device of claim 2, wherein the second wire and the fourth wire have the same diameter.

6. The semiconductor device of claim 4, wherein a diameter of the first wire and the third wire is one of 0.8-0.9 mils and 1.0-1.1 mils.

7. The semiconductor device of claim 5, wherein a diameter of the second wire and the fourth wire is one of 0.8-0.9 mils and 1.0-1.1 mils.

8. The semiconductor device of claim 1, wherein a fifth bonding pad of the second plurality of bonding pads is positioned such that a fifth wire bonded to the fifth bonding pad is a substantially uniform distance from a sixth wire bonded to a sixth bonding pad of the first plurality of bonding pads.

9. The semiconductor device of claim 8, wherein the substantially uniform distance provides for a maximum mutual inductance effect.

10. The semiconductor device of claim 3, wherein the substantially uniform distance provides for a maximum mutual inductance effect.

11. The semiconductor device of claim 1, wherein the first and second pluralities of bonding pads are 100-150 microns apart and nominal pad-size of 60×60 to 80×80 microns (width*height).

12. A method of manufacturing a semiconductor device comprising:
   arranging a first plurality of bonding pads on the semiconductor device; and
   arranging a second plurality of bonding pads on the semiconductor device, the first plurality of bonding pads forming a first row in a first plane parallel to a first edge of the semiconductor device, and the second plurality of bonding pads forming a second row in a second plane parallel to the first edge, the first plane proximal to the first edge, one of the first plurality of bonding pads and one of the second plurality of bonding pads forming a differential pair, and wherein wires bonded to the first and second pluralities of bonding pads each extend to associated external bond fingers arranged in a single row parallel to the first edge of the semiconductor device, wherein a spacing between the wires bonded to the one of the first plurality of bonding pads and the one of the second plurality of bonding pads of the differential pair remains substantially uniform, wherein spacing between second bonding pads of the second plurality of bonding pads is variable.

13. The method of manufacturing the semiconductor device of claim 12, wherein a first wire bonded to a first bonding pad of the first plurality of bonding pads is of a different diameter than a second wire bonded to a second bonding pad of the first plurality of bonding pads, and wherein a third wire bonded to a third bonding pad of the second plurality of bonding pads is of a different diameter than a fourth wire bonded to a fourth bonding pad of the second plurality of bonding pads.

14. The method of manufacturing the semiconductor device of claim 13, wherein the third bonding pad of the second plurality of bonding pads is positioned such that the third wire bonded to the third bonding pad is a substantially uniform distance from the first wire bonded to the first bonding pad of the first plurality of bonding pads.

15. The method of manufacturing the semiconductor device of claim 13, wherein the first wire and the third wire have the same diameter.

16. The method of manufacturing the semiconductor device of claim 13, wherein the second wire and the fourth wire have the same diameter.

17. The method of manufacturing the semiconductor device of claim 15, wherein a diameter of the first wire and the third wire is one of 0.8-0.9 mils and 1.0-1.1 mils.

18. The method of manufacturing the semiconductor device of claim 16, wherein a diameter of the second wire and the fourth wire is one of 0.8-0.9 mils and 1.0-1.1 mils.

19. The method of manufacturing the semiconductor device of claim 12, wherein a fifth bonding pad of the second plurality of bonding pads is positioned such that a fifth wire bonded to the fifth bonding pad is a substantially uniform distance from a sixth wire bonded to a sixth bonding pad of the first plurality of bonding pads.

20. The method of manufacturing the semiconductor device of claim 19, wherein the substantially uniform distance provides for a maximum mutual inductance effect.

21. The method of manufacturing the semiconductor device of claim 14, wherein the substantially uniform distance provides for a maximum mutual inductance effect.

22. The method of manufacturing the semiconductor device of claim 13, wherein the first wire and the second wire are bonded to the first and second bonding pads of the first plurality of bonding pads, respectively, in separate wire bonding steps, and wherein the third wire and the fourth wire are bonded to the third and the fourth bonding pads of the second plurality of bonding pads, respectively, in separate wire bonding steps.

23. The semiconductor device of claim 12, wherein the first and second pluralities of bonding pads are 100-150 microns apart.

24. A process comprising:
a means for arranging a first plurality of bonding pads on the semiconductor device; and
a means for arranging a second plurality of bonding pads on the semiconductor device, the first plurality of bonding pads forming a first row in a first plane parallel to a first edge of the semiconductor device, and the second plurality of bonding pads forming a second row in a second plane parallel to the first edge, the first plane proximal to the first edge, one of the first plurality of bonding pads and one of the second plurality of bonding pads forming a differential pair, wherein wires bonded to the first and second pluralities of bonding pads each extend to associated external bond fingers arranged in a single row parallel to the first edge of the semiconductor device, wherein a spacing between the wires bonded to the one of the first plurality of bonding pads and the one of the second plurality of bonding pads of the differential pair remains substantially uniform, wherein spacing between second bonding pads of the second plurality of bonding pads is variable.

25. The process for manufacturing the semiconductor device of claim 24, wherein a first wire bonded to a first bonding pad of the first plurality of bonding pads is of a different diameter than a second wire bonded to a second bonding pad of the first plurality of bonding pads, and wherein a third wire bonded to a third bonding pad of the second plurality of bonding pads is of a different diameter than a fourth wire bonded to a fourth bonding pad of the second plurality of bonding pads.

26. The process for manufacturing the semiconductor device of claim 25, wherein the third bonding pad of the second plurality of bonding pads is positioned such that the third wire bonded to the third bonding pad is a substantially uniform distance from the first wire bonded to the first bonding pad of the first plurality of bonding pads.

27. The process for manufacturing the semiconductor device of claim 24, wherein the first and second pluralities of bonding pads are 100-150 microns apart and nominal pad-size of 60×60 to 80×80 microns (width*height).

* * * * *